(12) United States Patent
Lien et al.

(10) Patent No.: US 12,334,365 B2
(45) Date of Patent: Jun. 17, 2025

(54) EXHAUST PIPING FOR A SEMICONDUCTOR PROCESSING TOOL

(71) Applicant: Taiwan Semiconductor Manufacturing Company, Ltd., Hsinchu (TW)

(72) Inventors: Kuo-Sheng Lien, Hsinchu (TW); Yung-Ho Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 811 days.

(21) Appl. No.: 17/446,580

(22) Filed: Aug. 31, 2021

(65) Prior Publication Data
US 2023/0065093 A1 Mar. 2, 2023

(51) Int. Cl.
| | |
|---|---|
| *B08B 3/08* | (2006.01) |
| *B08B 13/00* | (2006.01) |
| *F26B 3/04* | (2006.01) |
| *F26B 9/10* | (2006.01) |
| *F26B 21/00* | (2006.01) |
| *H01L 21/67* | (2006.01) |
| *H01L 21/677* | (2006.01) |

(52) U.S. Cl.
CPC .......... *H01L 21/67023* (2013.01); *B08B 3/08* (2013.01); *B08B 13/00* (2013.01); *F26B 3/04* (2013.01); *F26B 9/10* (2013.01); *F26B 21/004* (2013.01); *H01L 21/67017* (2013.01); *H01L 21/67028* (2013.01); *H01L 21/6704* (2013.01); *H01L 21/67057* (2013.01); *H01L 21/67075* (2013.01); *H01L 21/67086* (2013.01); *H01L 21/67757* (2013.01)

(58) Field of Classification Search
None
See application file for complete search history.

(56) References Cited

U.S. PATENT DOCUMENTS

2019/0371629 A1\* 12/2019 Randhawa ........ H01L 21/67051

\* cited by examiner

*Primary Examiner* — Levon J Shahinian
(74) *Attorney, Agent, or Firm* — Harrity & Harrity, LLP

(57) ABSTRACT

A semiconductor processing tool may include a processing tank. The semiconductor processing tool may include an arm arranged to hold a plurality of wafers over the processing tank such that wafers in the plurality of wafers are horizontally stacked over the processing tank. The semiconductor processing tool may include a fan arranged over the arm to permit an airflow to be provided across surfaces of the wafers in a vertical direction toward the processing tank. The semiconductor processing tool may include an exhaust system including at least one exhaust output and one or more exhaust pipe segments arranged substantially around the processing tank and connected to the at least one exhaust output. The one or more exhaust pipe segments may include a plurality of openings to receive exhaust air to be provided to the at least one exhaust output.

20 Claims, 7 Drawing Sheets

100 ⟶

EXHAUST PIPING FOR A SEMICONDUCTOR PROCESSING TOOL

BACKGROUND

A semiconductor processing tool, such as a wet bench, may include a fan used for drying a group of wafers after processing by the semiconductor processing tool (e.g., after wet cleaning, after wet etching, or the like). The fan may, for example, be mounted over a position at which a stack of wafers is horizontally held by an arm of the semiconductor processing tool. Here, the arrangement of the fan permits the fan to blow air across the top and bottom surfaces of the wafers in the stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
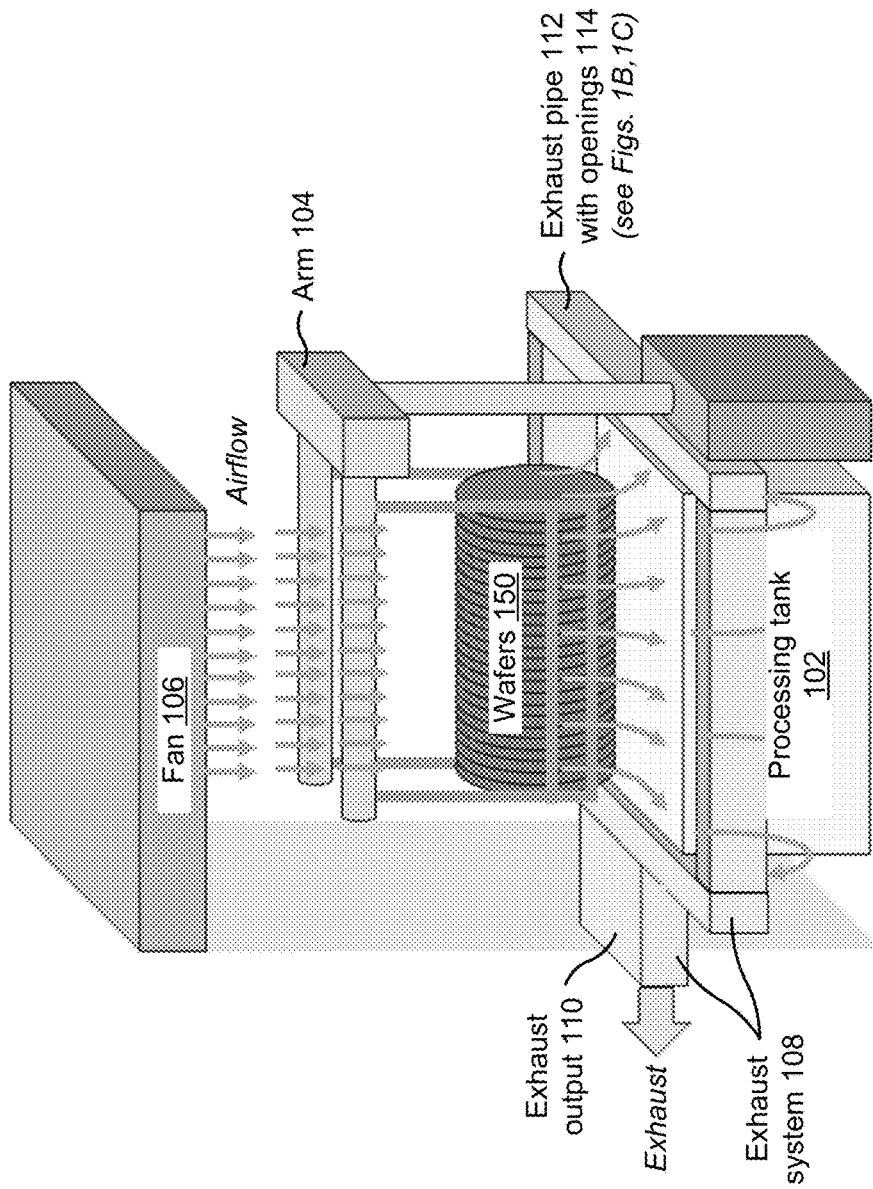
FIGS. 1A-1C are diagrams of an example implementation of a semiconductor processing tool including an exhaust system, as described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor processing tool including a fan used for drying wafers (e.g., after processing) also includes an exhaust output for drawing exhaust air from the semiconductor processing tool. The exhaust output is mounted on one side of a processing tank of the semiconductor processing tool to draw the exhaust air as air is blown over the wafers by the fan. However, the exhaust output being mounted on only one side of the semiconductor processing tool causes air to flow generally in a single direction (toward an intake of the exhaust output). This unidirectional air flow can result in a concentration of acid gas and/or a moisture concentration being uneven among wafers after drying, which can increase a defect rate in wafers processed by the semiconductor processing tool and lead to increased costs and additional operations by this and/or one or more other semiconductor processing tools to address defective wafers.

Some implementations described herein provide an exhaust system for a semiconductor processing tool. In some implementations, the exhaust system includes at least one exhaust output, and one or more exhaust pipe segments arranged substantially around the processing tank. The one or more exhaust pipe segments include openings to receive exhaust air to be provided to the at least one exhaust output. In some implementations, the exhaust system being substantially around the processing tank (e.g., 360 degrees around) causes airflow to be uniformly distributed within the environment of the semiconductor processing tool (e.g., such that the air flows in all directions around the wafers, rather than a single direction). As a result, a concentration of acid gas and/or a moisture concentration may be relatively even among wafers in the stack, thereby decreasing a defect rate in wafers processed by the semiconductor processing tool and reduce costs and additional operations that would have otherwise been performed by this and/or one or more other semiconductor processing tools to address defective wafers.

Figure 1B:
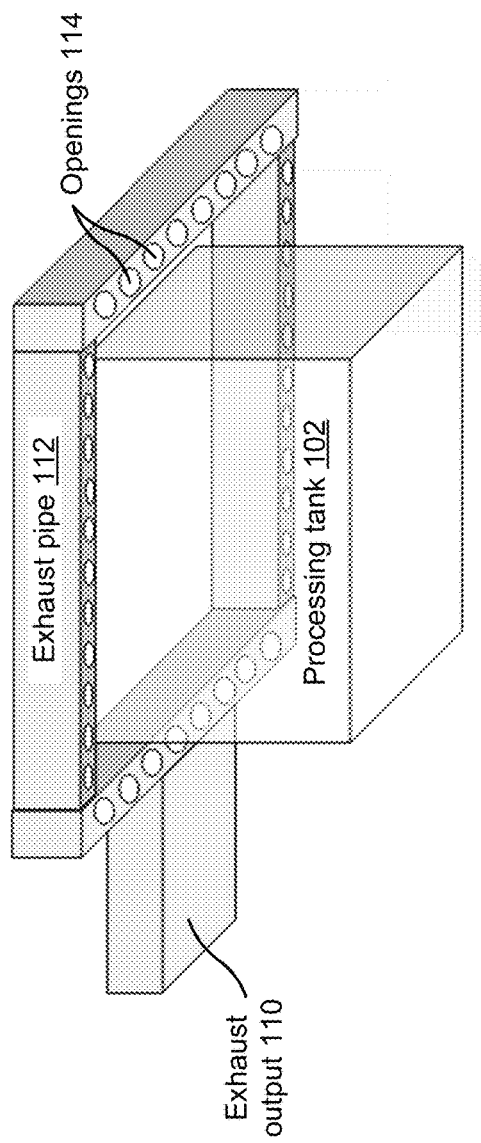
Figure 1C:
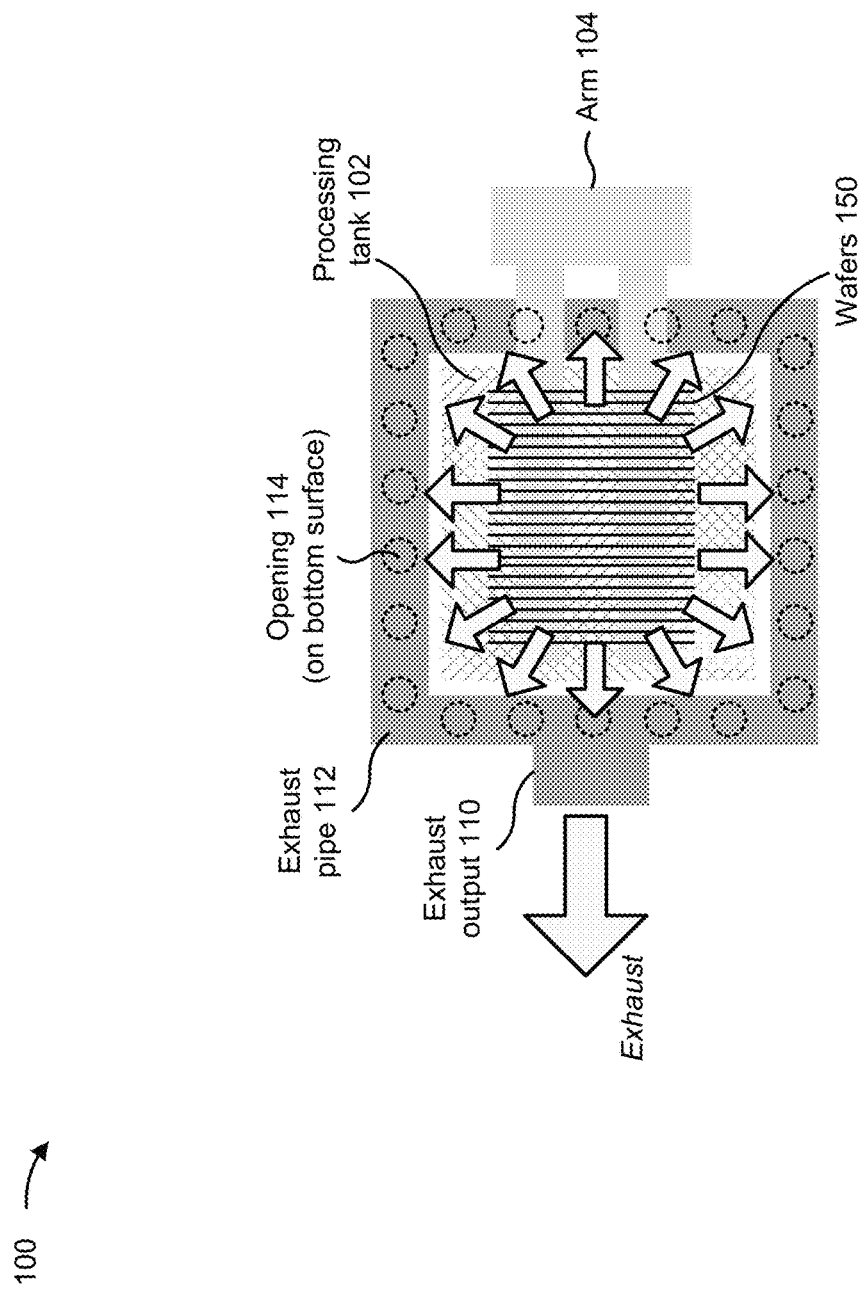

FIGS. 1A-1C are diagrams of an example implementation of a semiconductor processing tool 100 including an exhaust system 108, as described herein. The semiconductor processing tool 100 may be, for example, a wet bench designed to perform wet cleaning, wet etching, or another type of semiconductor processing operation.

As shown in FIGS. 1A-1C, the semiconductor processing tool 100 includes a processing tank 102, an arm 104, a fan 106, and the exhaust system 108, where the exhaust system 108 includes at least one exhaust output 110 and one or more exhaust pipe segments 112. As described in further detail below, the one or more exhaust pipe segments 112 include a plurality of openings 114. FIG. 1A illustrates an isometric view of the semiconductor processing tool 100 from above the exhaust system 108, FIG. 1B illustrates an isometric view of the processing tank 102 and the exhaust system 108 from below the exhaust system 108, and FIG. 1C is a two-dimensional (2D) top view of the semiconductor processing tool 100 from above the arm 104.

The processing tank 102 is a component associated with performing a semiconductor processing operation on one or more wafers 150 (e.g., one or more semiconductor wafers). For example, the processing tank 102 may be a tank that stores a solution (e.g., a liquid solution) associated with wet cleaning the one or more wafers 150, wet etching the one or more wafers 150, or the like. In some implementations, the one or more wafers 150 may be held above the processing tank 102 while the fan 106 provides an airflow toward the one or more wafers 150 (e.g., in association with drying the one or more wafers 150).

The arm 104 is a component to move, hold, or otherwise control a position of one or more wafers 150 in association with the semiconductor process operation performed by the semiconductor processing tool 100. For example, the arm 104 may be capable of grabbing a plurality of wafers 150 (e.g., a stack of wafers in a wafer carrier), submerging the plurality of wafers 150 a solution in the processing tank 102, removing the plurality of wafers 150 from the solution, and holding the plurality of wafers 150 over the processing tank 102 (e.g., during drying of the plurality of wafers 150). In some implementations, as indicated in FIG. 1A, the arm 104 may be arranged to permit the arm 104 to hold the plurality of wafers 150 such that wafers 150 in the plurality of wafers 150 are horizontally stacked over the processing tank 102 (e.g., such that top and bottom surfaces of each of the plurality of wafers 150 are oriented in a vertical direction).

The fan 106 is a component to provide an airflow across surfaces of the plurality of wafers 150 (e.g., in association with drying the wafers 150). For example, the fan 106 may provide an airflow across (e.g., parallel to) top and bottom surfaces of wafers 150 of the plurality of wafers 150 while the arm 104 holds the plurality of wafers 150 over the processing tank 102 after the arm 104 has removed the plurality of wafers 150 from the processing tank 102. In some implementations, as shown in FIG. 1A, the fan 106 is arranged over the arm 104 to permit the airflow to be provided across the surfaces of the plurality of wafers 150 in a vertical direction (e.g., a downward direction from the fan 106 toward the processing tank 102).

The exhaust system 108 is a component to draw exhaust air from the environment of the semiconductor processing tool 100 and direct the exhaust air away from the semiconductor processing tool 100. In some implementations, the exhaust system 108 may draw the exhaust air away from the environment of the semiconductor processing tool 100 concurrently with the fan 106 providing the airflow over the surfaces of the plurality of wafers 150 (e.g., such that air flows over the surfaces of the plurality of wafers 150 and is drawn away by the exhaust system 108). As shown, the exhaust system 108 may include at least one exhaust output 110 and one or more exhaust pipe segments 112.

The exhaust output 110 is a component to receive exhaust air from one or more exhaust pipe segments 112 and direct the exhaust air away from the environment of the semiconductor processing tool 100. In some implementations, as illustrated in FIGS. 1A-1C, the exhaust system 108 may include a single exhaust output 110, and each of one or more exhaust pipe segments 112 of the exhaust system 108 are connected to the single exhaust output 110. Alternatively, in some implementations, the exhaust system 108 may include a plurality of exhaust outputs, and at least one exhaust pipe segment 112 of the one or more exhaust pipe segments 112 is connected to each exhaust output 110 of the plurality of exhaust outputs 110. For example, when the one or more exhaust pipe segments 112 include a first exhaust pipe segment 112 and a second exhaust pipe segment 112 that are not connected to one another, the first exhaust pipe segment 112 may be connected to a first exhaust output 110 on a first side of the processing tank 102 and the second exhaust pipe segment 112 may be connected to a second exhaust output 110 on a second (e.g., different, such as opposite) side of the processing tank 102.

The exhaust pipe segment 112 is a component to receive the exhaust air from the environment of the semiconductor processing tool 100 and provide the exhaust air to an exhaust output 110 (e.g., such that the exhaust air can be directed away from the environment of the semiconductor processing tool 100 by the exhaust output 110).

In some implementations, the one or more exhaust pipe segments 112 of the exhaust system 108 are arranged substantially around (e.g., on at least two sides of) the processing tank 102. For example, the one or more exhaust pipe segments 112 may be arranged 360 degrees around the processing tank 102. In the particular example shown in FIGS. 1A-1C, the one or more exhaust pipe segments 112 are arranged around an entirety of the perimeter of the processing tank 102. Additional details regarding the arrangement of the one or more exhaust pipe segments 112 are described below with respect to FIGS. 2A-2C.

In some implementations, the one or more exhaust pipe segments 112 include a plurality of openings 114 to receive exhaust air to be provided to the at least one exhaust output 110. In some implementations, the plurality of openings 114 may be arranged substantially around the perimeter of the processing tank 102. For example, the plurality of openings 114 may be (evenly) distributed around the perimeter of the processing tank 102, as shown in FIGS. 1B and 1C. In some implementations, the plurality of openings 114 is symmetrically arranged with respect to a center axis on a plane corresponding to the processing tank 102. In some implementations, such an arrangement of the openings 114 causes airflow within the environment of the semiconductor processing tool to be relatively uniformly distributed because exhaust air is drawn into the openings 114 at multiple locations substantially around the perimeter of the processing tank 102 (e.g., rather than at single location as with prior exhaust outputs). As a result, air flows in all directions around wafers 150 being dried in the semiconductor processing tool 100, which results in a more even concentration of acid gas and/or a moisture concentration among the wafers 150, thereby decreasing a defect rate in wafers processed by the semiconductor processing tool 100.

In some implementations, one or more openings 114 may be on a bottom surface of an exhaust pipe segment 112. That is, in some implementations, one or more openings 114 may be on a surface of the exhaust pipe segment 112 that faces a bottom of the processing tank 102, or on a surface of the exhaust pipe segment 112 that faces away from the fan 106. In some implementations, an opening 114 being on the bottom surface of the exhaust pipe segment 112 may act to prevent material (e.g., liquid droplets) from entering the opening 114 that could damage the exhaust pipe segment 112. In some implementations, one or more openings 114 may be on a side surface of an exhaust pipe segment 112 of the one or more exhaust pipe segments 112 (e.g., a surface facing a side of the processing tank 102, a surface opposite to the surface facing the side of the processing tank 102, or the like). In some implementations, one or more openings 114 may be on a top surface of an exhaust pipe segment 112 of the one or more exhaust pipe segments 112 (e.g., a surface facing toward the fan 106). In some implementations, an exhaust pipe segment 112 may include one or more openings 114 on a bottom surface of the exhaust pipe segment 112, one or more openings 114 on a side surface of the exhaust pipe segment 112, and/or one or more openings 114 on a top surface of the exhaust pipe segment 112.

As indicated above, FIGS. 1A-1C are provided as an example. Other examples may differ from what is described with regard to FIGS. 1A-1C. The number and arrangement of components shown in FIGS. 1A-1C are provided as an example. In practice, there may be additional components, fewer components, different components, or differently arranged components than those shown in FIGS. 1A-1C. Furthermore, two or more components shown in FIGS. 1A-1C may be implemented within a single component, or a single component shown in FIGS. 1A-1C may be implemented as multiple, distributed components.

Additionally, or alternatively, a set of components (e.g., one or more components) shown in FIGS. 1A-1C may perform one or more functions described as being performed by another set of components shown in FIGS. 1A-1C.

Figure 2A:
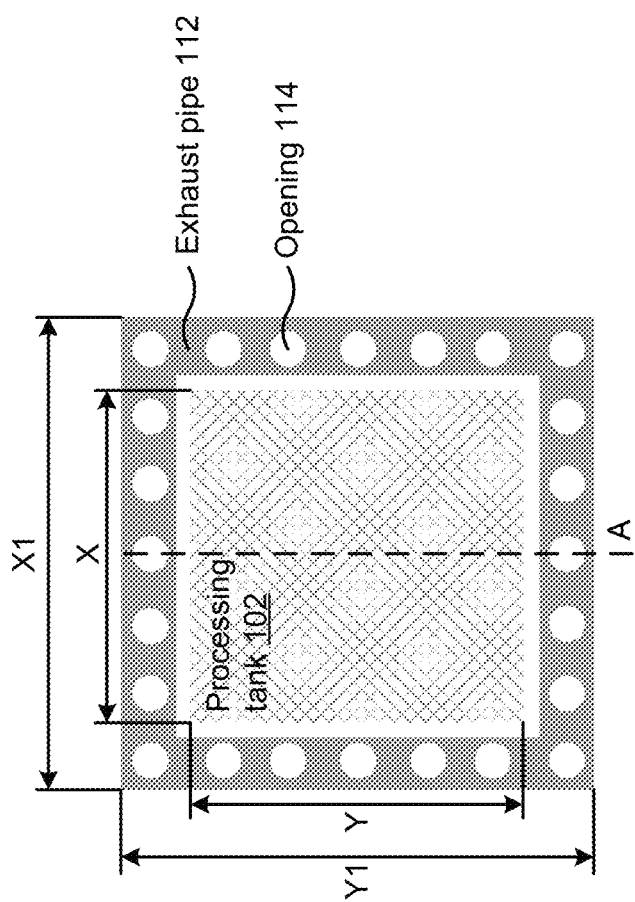
FIGS. 2A-2C are diagrams illustrating various example arrangements of exhaust pipe segments of the exhaust system described in connection with FIGS. 1A-1C.
Figure 2B:
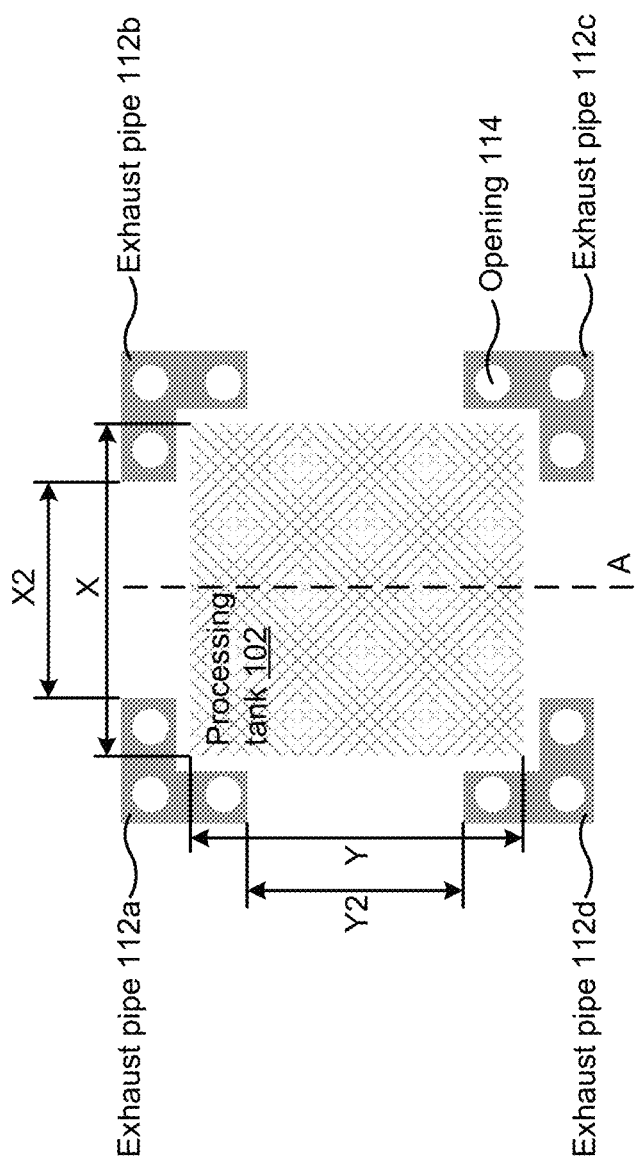
Figure 2C:
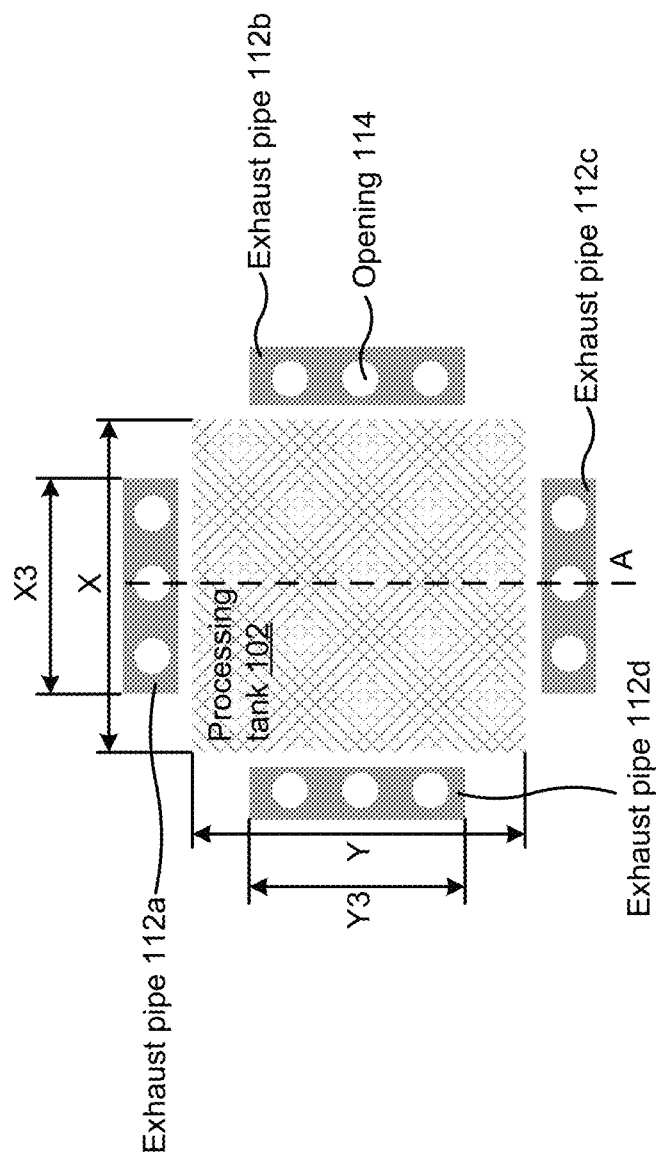

FIGS. 2A-2C are diagrams illustrating various example arrangements of exhaust pipe segments 112 of the exhaust system 108. FIGS. 2A-2C illustrate 2D bottom views of the exhaust pipe segments 112 of the exhaust system 108. For purposes of clarity, only the one or more exhaust pipe segments 112 (with openings 114) and the processing tank 102 are shown in FIGS. 2A-2C.

In some implementations, the one or more exhaust pipe segments 112 consist of a single exhaust pipe segment 112 that is substantially around (e.g., on at least two sides of) a perimeter of the processing tank 102. FIG. 2A is a diagram illustrating an example of a single exhaust pipe segment 112 that is around an entirety of the perimeter of the processing tank 102. Notably, in the example shown in FIG. 2A, a pattern of the plurality of openings 114 is substantially symmetrical with respect to a center axis A on a plane corresponding to the processing tank 102. In some implementations, as illustrated in FIG. 2A, a length of a given side of the exhaust pipe segment 112 may be greater than or equal to a length of a corresponding side of the processing tank 102 (e.g., X1 may be greater than or equal to X and/or Y1 may be greater than or equal to Y).

In some implementations, the one or more exhaust pipe segments 112 includes a plurality of exhaust pipe segments 112 arranged such that a gap is present along a side of the processing tank 102 between two of the plurality of exhaust pipe segments 112. For example, as shown in FIG. 2B, exhaust pipe segments 112a through 112d may be arranged around the processing tank 102 such that a first gap is between exhaust pipe segments 112a and 112b along a first side of the processing tank 102, a second gap is between exhaust pipe segments 112b and 112c along a second side of the processing tank 102, a third gap is between exhaust pipe segments 112c and 112d along a third side of the processing tank 102, and a fourth gap is between exhaust pipe segments 112d and 112a along a fourth side of the processing tank 102. In some implementations, as illustrated in FIG. 2B, a length of a gap along a side of the processing tank 102 may be less than or equal to a length of a corresponding side of the processing tank 102 (e.g., X2 may be less than or equal to X and/or Y2 may be less than or equal to Y). Notably, in the example shown in FIG. 2B, a pattern of the plurality of openings 114 is substantially symmetrical with respect to a center axis A on a plane corresponding to the processing tank 102. In some implementations, the exhaust pipe segments 112a through 112d may be connected to a single exhaust output 110 or to different exhaust outputs 110.

In some implementations, the one or more exhaust pipe segments 112 includes a plurality of exhaust pipe segments 112 arranged such that a gap is present at a corner of the processing tank 102 between two of the plurality of exhaust pipe segments 112. For example, as shown in FIG. 2C, exhaust pipe segments 112a through 112d may be arranged around the processing tank 102 such that a first gap is between exhaust pipe segments 112a and 112b at a first corner of the processing tank 102, a second gap is between exhaust pipe segments 112b and 112c at a second corner of the processing tank 102, a third gap is between exhaust pipe segments 112c and 112d at a third corner of the processing tank 102, and a fourth gap is between exhaust pipe segments 112d and 112a at a fourth corner of the processing tank 102. In some implementations, as illustrated in FIG. 2C, a length of an exhaust pipe segment 112 along a side of the processing tank 102 may be less than or equal to a length of a corresponding side of the processing tank 102 (e.g., X3 may be less than or equal to X and/or Y3 may be less than or equal to Y). Notably, in the example shown in FIG. 2C, a pattern of the plurality of openings 114 is substantially symmetrical with respect to a center axis A on a plane corresponding to the processing tank 102. In some implementations, the exhaust pipe segments 112a through 112d may be connected to a single exhaust output 110 or to different exhaust outputs 110.

Notably, a combination of feature shown in FIGS. 2A-2C may be present in a given exhaust system 108. For example, in some implementations, a length of an exhaust pipe segment 112 on a first side of the processing tank 102 may be greater than or equal to a length of the first side of the processing tank 102 (e.g., X1≥X), while a length of a gap along a second side of the processing tank 102 may be less than or equal to a length of a second side of the processing tank 102 (e.g., Y2≤Y). As another example, in some implementations, a length of an exhaust pipe segment 112 on a first side of the processing tank 102 may be greater than or equal to a length of the first side of the processing tank 102 (e.g., X1≥X), while a length of an exhaust pipe segment 112 along a second side of the processing tank 102 may be less than or equal to a length of a second side of the processing tank 102 (e.g., Y3≤Y). As another example, in some implementations, a length of a gap along a first side of the processing tank 102 may be less than or equal to a length of a first side of the processing tank 102 (e.g., X2≤X), while a length of an exhaust pipe segment 112 along a second side of the processing tank 102 may be less than or equal to a length of a second side of the processing tank 102 (e.g., Y3≤Y).

Figure 3:
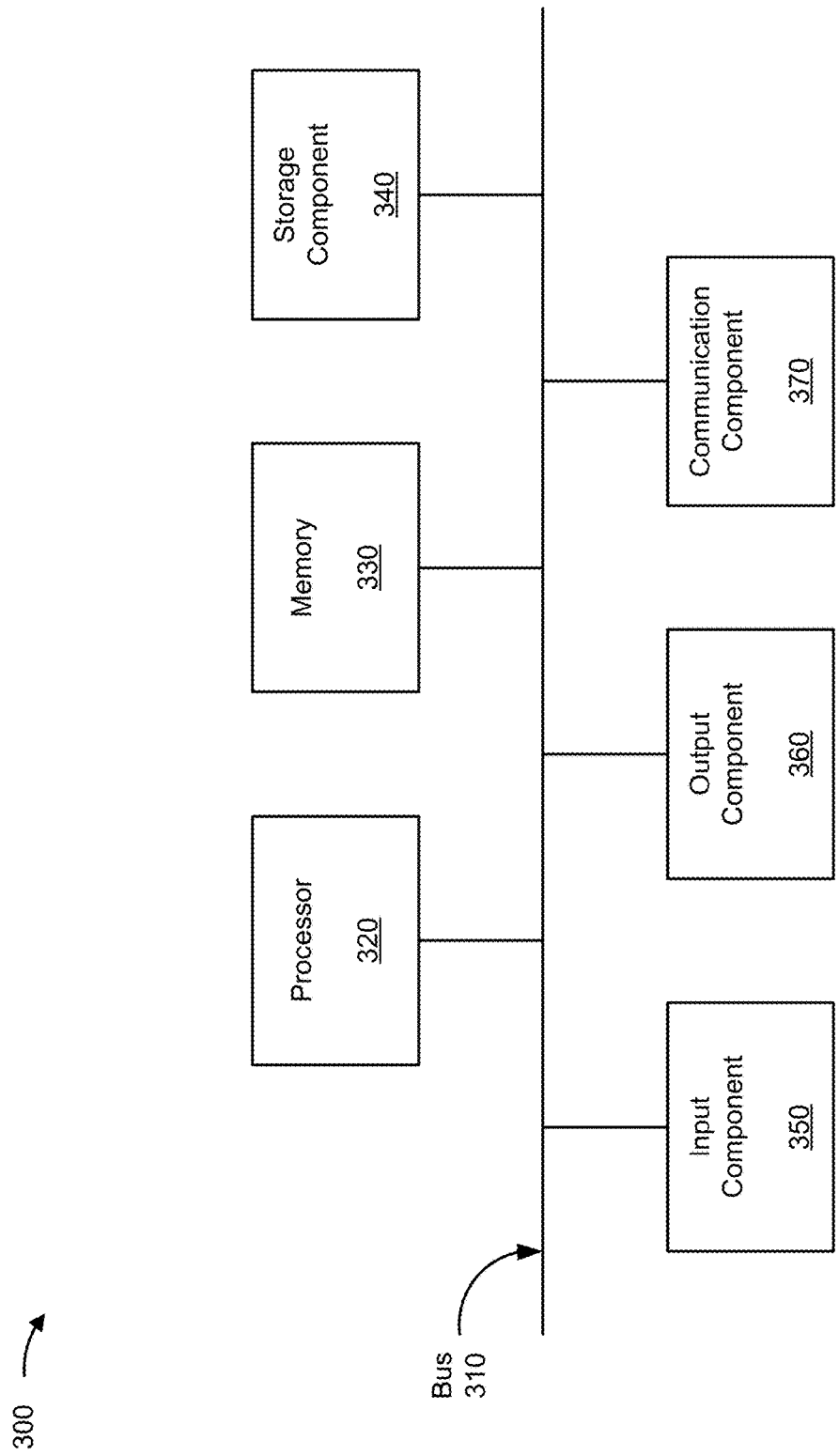
FIG. 3 is a diagram of example components of one or more devices of a semiconductor processing tool including an exhaust system, as described herein.

As indicated above, FIGS. 2A-2C are provided as an example. Other examples may differ from what is described with regard to FIGS. 2A-2C. The number and arrangement of components shown in FIGS. 2A-2C are provided as an example. In practice, there may be additional components, fewer components, different components, or differently arranged components than those shown in FIGS. 2A-2C. Furthermore, two or more components shown in FIGS. 2A-2C may be implemented within a single component, or a single component shown in FIGS. 2A-2C may be implemented as multiple, distributed components. Additionally, or alternatively, a set of components (e.g., one or more components) shown in FIGS. 2A-2C may perform one or more functions described as being performed by another set of components shown in FIGS. 2A-2C FIG. 3 is a diagram of example components of a device 300, which may correspond to the semiconductor processing tool 100 and/or one or more components of the semiconductor processing tool 100 (e.g., processing tank 102, arm 104, fan 106, exhaust system 108, or the like). In some implementations, the semiconductor processing tool 100 and/or the one or more components of the semiconductor processing tool 100 may include one or more devices 300 and/or one or more components of device 300. As shown in FIG. 3, device 300 may include a bus 310, a processor 320, a memory 330, a storage component 340, an input component 350, an output component 360, and a communication component 370.

Bus 310 includes a component that enables wired and/or wireless communication among the components of device 300. Processor 320 includes a central processing unit, a graphics processing unit, a microprocessor, a controller, a microcontroller, a digital signal processor, a field-programmable gate array, an application-specific integrated circuit, and/or another type of processing component. Processor 320 is implemented in hardware, firmware, or a combination of hardware and software. In some implementations, processor 320 includes one or more processors capable of being programmed to perform a function. Memory 330 includes a random access memory, a read only memory, and/or another type of memory (e.g., a flash memory, a magnetic memory, and/or an optical memory).

Storage component 340 stores information and/or software related to the operation of device 300. For example, storage component 340 may include a hard disk drive, a magnetic disk drive, an optical disk drive, a solid state disk drive, a compact disc, a digital versatile disc, and/or another type of non-transitory computer-readable medium. Input component 350 enables device 300 to receive input, such as user input and/or sensed inputs. For example, input component 350 may include a touch screen, a keyboard, a keypad, a mouse, a button, a microphone, a switch, a sensor, a global positioning system component, an accelerometer, a gyroscope, and/or an actuator. Output component 360 enables device 300 to provide output, such as via a display, a speaker, and/or one or more light-emitting diodes. Communication component 370 enables device 300 to communicate with other devices, such as via a wired connection and/or a wireless connection. For example, communication component 370 may include a receiver, a transmitter, a transceiver, a modem, a network interface card, and/or an antenna.

Device 300 may perform one or more processes described herein. For example, a non-transitory computer-readable medium (e.g., memory 330 and/or storage component 340) may store a set of instructions (e.g., one or more instructions, code, software code, and/or program code) for execution by processor 320. Processor 320 may execute the set of instructions to perform one or more processes described herein. In some implementations, execution of the set of instructions, by one or more processors 320, causes the one or more processors 320 and/or the device 300 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 3 are provided as an example. Device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

In this way, an exhaust system for a semiconductor processing tool may include one or more exhaust pipe segments arranged substantially around a processing tank, where the one or more or more exhaust pipe segments have openings to receive exhaust air to be provided to at least one exhaust output. As a result, airflow within the environment of the semiconductor processing tool may be uniformly distributed (e.g., such that the air flows in all directions around wafers being dried in the semiconductor processing tool, rather than a single direction), which causes a concentration of acid gas and/or a moisture concentration to be even among the wafers, thereby decreasing a defect rate in wafers processed by the semiconductor processing tool.

As described in greater detail above, some implementations described herein provide a semiconductor processing tool and an exhaust system of a semiconductor processing tool.

As described in greater detail above, some implementations described herein provide a semiconductor processing tool. The semiconductor processing tool includes a processing tank. The semiconductor processing tool includes an arm arranged to hold a plurality of wafers over the processing tank such that wafers in the plurality of wafers are horizontally stacked over the processing tank. The semiconductor processing tool includes a fan arranged over the arm to permit an airflow to be provided across surfaces of the wafers in a vertical direction toward the processing tank. The semiconductor processing tool includes an exhaust system including at least one exhaust output, and one or more exhaust pipe segments arranged substantially around the processing tank and connected to the at least one exhaust output, where the one or more exhaust pipe segments include a plurality of openings to receive exhaust air to be provided to the at least one exhaust output.

As described in greater detail above, some implementations described herein provide an exhaust system of a semiconductor processing tool. The exhaust system includes at least one exhaust output. The exhaust system includes one or more exhaust pipe segments connected to the at least one exhaust output, where the one or more exhaust pipe segments are substantially around a perimeter of a processing tank of the semiconductor processing tool, and where the one or more exhaust pipe segments include a plurality of openings, the plurality of openings being on one or more surfaces of the one or more exhaust pipe segments and being substantially around the perimeter of the processing tank.

As described in greater detail above, some implementations described herein provide a semiconductor processing tool. The semiconductor processing tool includes a processing tank. The semiconductor processing tool includes a fan arranged over the processing tank to cause an airflow to be provided toward the processing tank. The semiconductor processing tool includes an exhaust system including one or more exhaust pipe segments arranged on at least two sides of the processing tank, where the one or more exhaust pipe segments include a plurality of openings to receive exhaust air to be provided to one or more exhaust outputs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor processing tool, comprising:
   a processing tank;
   an arm arranged to hold a plurality of wafers over the processing tank such that wafers in the plurality of wafers are horizontally stacked over the processing tank; and
   a fan arranged over the arm to permit an airflow to be provided across surfaces of the wafers in a vertical direction toward the processing tank; and an exhaust system including:
  at least one exhaust output to direct exhaust air away from the semiconductor processing tool, and
  one or more exhaust pipe segments arranged substantially around the processing tank and connected to the at least one exhaust output,
    wherein the one or more exhaust pipe segments include a plurality of openings on a bottom end of the one or more exhaust pipe segments to receive the exhaust air to be provided to the at least one exhaust output.

2. The semiconductor processing tool of claim 1, wherein the one or more exhaust pipe segments are arranged 360 degrees around the processing tank.

3. The semiconductor processing tool of claim 1, wherein the plurality of openings are evenly distributed around a perimeter of the processing tank.

4. The semiconductor processing tool of claim 1, wherein at least one opening of the plurality of openings is on a bottom surface of an exhaust pipe segment of the one or more exhaust pipe segments.

5. The semiconductor processing tool of claim 1, wherein at least one opening of the plurality of openings is on a side surface of an exhaust pipe segment of the one or more exhaust pipe segments.

6. The semiconductor processing tool of claim 1, wherein at least one opening of the plurality of openings is on a top surface of an exhaust pipe segment of the one or more exhaust pipe segments.

7. The semiconductor processing tool of claim 1, wherein the one or more exhaust pipe segments include a plurality of exhaust pipe segments arranged such that a gap is present along a side of the processing tank between two of the plurality of exhaust pipe segments.

8. The semiconductor processing tool of claim 1, wherein the one or more exhaust pipe segments include a plurality of exhaust pipe segments arranged such that a gap is present at a corner of the processing tank between two of the plurality of exhaust pipe segments.

9. The semiconductor processing tool of claim 1, wherein the plurality of openings are symmetrically arranged with respect to a center axis on a plane corresponding to the processing tank.

10. The semiconductor processing tool of claim 1, wherein the semiconductor processing tool is a wet bench.

11. The semiconductor processing tool of claim 1, wherein the one or more exhaust pipe segments include a plurality of exhaust pipe segments and the at least one exhaust output includes a plurality of exhaust outputs, wherein an exhaust pipe segment of the plurality of exhaust pipe segments is to provide exhaust air to one of the plurality of exhaust outputs.

12. An exhaust system of a semiconductor processing tool, the exhaust system comprising:
  at least one exhaust output; and
  one or more exhaust pipe segments connected to the at least one exhaust output,
    wherein the one or more exhaust pipe segments are substantially around a perimeter of a processing tank of the semiconductor processing tool, and
    wherein the one or more exhaust pipe segments comprises a top surface, exposed to a fan of the semiconductor processing tool, and a bottom surface comprising one or more openings.

13. The exhaust system of claim 12, wherein the one or more exhaust pipe segments are arranged around an entirety of the perimeter of the processing tank.

14. The exhaust system of claim 12, wherein the one or more openings include plurality of openings distributed around an entirety of the perimeter of the processing tank.

15. The exhaust system of claim 12, wherein the one or more exhaust pipe segments include a plurality of exhaust pipe segments, wherein a gap is present between two of the plurality of exhaust pipe segments along a side of the processing tank or at a corner of the processing tank.

16. The exhaust system of claim 12, wherein the one or more openings include a plurality of openings, and wherein a pattern of the plurality of openings is substantially symmetrical with respect to a center axis on a plane corresponding to the processing tank.

17. The exhaust system of claim 12, wherein the one or more openings include a plurality of openings evenly distributed around an entirety of the perimeter of the processing tank.

18. A semiconductor processing tool, comprising:
  a processing tank;
  a fan arranged over the processing tank to cause an airflow to be provided toward the processing tank; and
  an exhaust system including one or more exhaust pipe segments arranged on at least two sides of the processing tank,
    wherein the one or more exhaust pipe segments comprises a top surface, exposed to the fan, and a bottom surface comprising one or more openings to receive exhaust air to be provided to one or more exhaust outputs.

19. The semiconductor processing tool of claim 18, wherein the one or more exhaust pipe segments consist of a single exhaust pipe segment that is around a perimeter of the processing tank.

20. The semiconductor processing tool of claim 18, wherein the one or more exhaust pipe segments include a plurality of exhaust pipe segments arranged such that a first gap is present along a first side of the processing tank between a first two of the plurality of exhaust pipe segments and that a second gap is present along a second side of the processing tank between a second two of the plurality of exhaust pipe segments.

* * * * *